(12) United States Patent
Zahurak et al.

(10) Patent No.: US 8,772,848 B2
(45) Date of Patent: Jul. 8, 2014

(54) CIRCUIT STRUCTURES, MEMORY CIRCUITRY, AND METHODS

(75) Inventors: John K. Zahurak, Eagle, ID (US); Sanh D. Tang, Boise, ID (US); Lars P. Heineck, Garden City, ID (US); Martin C. Roberts, Boise, ID (US); Wolfgang Mueller, Garden City, ID (US); Haitao Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 13/191,293

(22) Filed: Jul. 26, 2011

(65) Prior Publication Data

US 2013/0026471 A1 Jan. 31, 2013

(51) Int. Cl.
*H01L 27/108* (2006.01)
*H01L 29/94* (2006.01)

(52) U.S. Cl.
USPC .................................. 257/296; 257/E27.084

(58) Field of Classification Search
USPC .................. 257/347–351, 296, 302, E27.054, 257/E27.084, E29.274, E21.646, E21.653
See application file for complete search history.

(56) References Cited

U.S. PATENT DOCUMENTS

| | | | | |
|---|---|---|---|---|
| 4,487,639 A | * | 12/1984 | Lam et al. | 438/297 |
| 5,920,105 A | * | 7/1999 | Okamoto et al. | 257/410 |
| 6,245,663 B1 | * | 6/2001 | Zhao et al. | 438/622 |
| 7,368,352 B2 | | 5/2008 | Kim et al. | |
| 7,560,336 B2 | | 7/2009 | Abbott | |
| 7,736,969 B2 | | 6/2010 | Abbott et al. | |
| 7,883,962 B2 | | 2/2011 | Noble | |
| 2002/0190298 A1 | | 12/2002 | Alsmeier et al. | |
| 2004/0262679 A1 | * | 12/2004 | Ohsawa | 257/331 |
| 2007/0018223 A1 | * | 1/2007 | Abbott | 257/303 |
| 2008/0246023 A1 | * | 10/2008 | Zeng et al. | 257/25 |
| 2009/0246952 A1 | * | 10/2009 | Ishizaka et al. | 438/653 |
| 2009/0250738 A1 | * | 10/2009 | Dyer | 257/301 |
| 2010/0248153 A1 | * | 9/2010 | Lee et al. | 430/312 |
| 2011/0006377 A1 | * | 1/2011 | Lee et al. | 257/379 |
| 2011/0163357 A1 | * | 7/2011 | Tan et al. | 257/288 |
| 2011/0223725 A1 | * | 9/2011 | Kang et al. | 438/151 |

* cited by examiner

*Primary Examiner* — Daniel Luke
*Assistant Examiner* — Khaja Ahmad
(74) *Attorney, Agent, or Firm* — Wells St. John, P.S.

(57) ABSTRACT

A circuit structure includes a substrate having an array region and a peripheral region. The substrate in the array and peripheral regions includes insulator material over first semiconductor material, conductive material over the insulator material, and second semiconductor material over the conductive material. The array region includes vertical circuit devices which include the second semiconductor material. The peripheral region includes horizontal circuit devices which include the second semiconductor material. The horizontal circuit devices in the peripheral region individually have a floating body which includes the second semiconductor material. The conductive material in the peripheral region is under and electrically coupled to the second semiconductor material of the floating bodies. Conductive straps in the array region are under the vertical circuit devices. The conductive straps include the conductive material and individually are electrically coupled to a plurality of the vertical circuit devices in the array region. Other implementations are disclosed.

14 Claims, 9 Drawing Sheets

CIRCUIT STRUCTURES, MEMORY CIRCUITRY, AND METHODS

TECHNICAL FIELD

Embodiments disclosed herein pertain to circuit structures, to memory circuitry, and to methods of making circuitry structures and memory circuitry.

BACKGROUND

A continuing trend in the electronics industry is the miniaturization of electronic devices. This is especially true for electronic devices operated through the use of semiconductor microchips. Microchips are commonly viewed as the brains of most electronic devices. In general, a microchip comprises a small substrate upon which are built millions or billions of nanoscopic electronic devices that are integrally configured to form electronic circuits. The circuits are interconnected in a unique way to perform a desired function.

Electronic devices may be formed side-by-side in a single plane on a common substrate, such as a silicon-comprising substrate. Some side-by-side devices are formed relative to semiconductor-on-insulator substrates, and can be subject to a phenomenon known as "floating body effect". Regardless, side-by-side positioning uses a relatively large amount of surface area, or "real estate," on the substrate. As a result, devices alternately or additionally may be formed vertically in an effort to use less horizontal substrate area.

DETAILED DESCRIPTION OF EXAMPLE EMBODIMENTS

Figure 1:
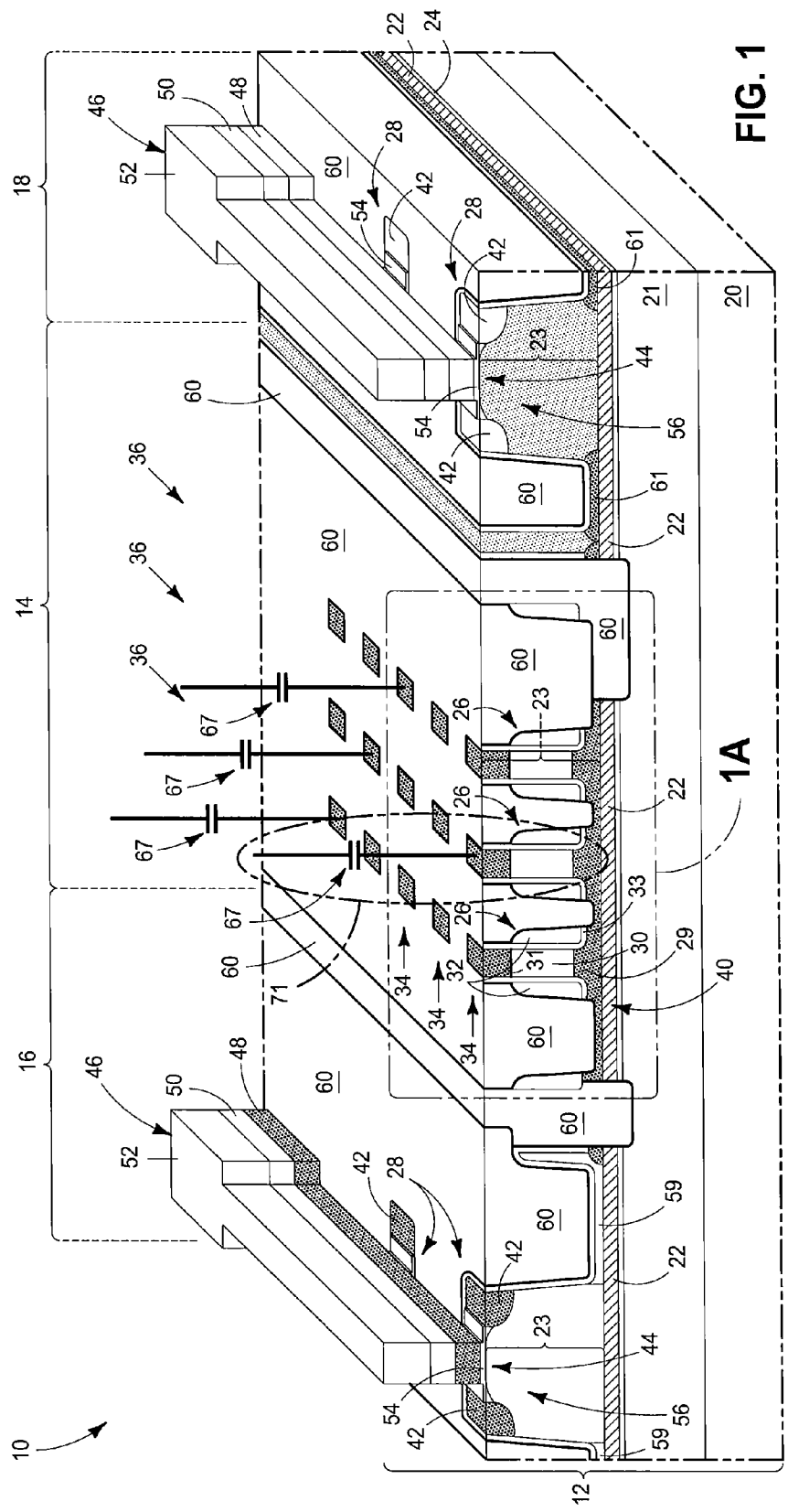
FIG. 1 is a diagrammatic oblique projection and partial schematic view of part of a circuit structure in accordance with an embodiment of the invention, with some operative components having been removed for clarity.
Figure 1A:
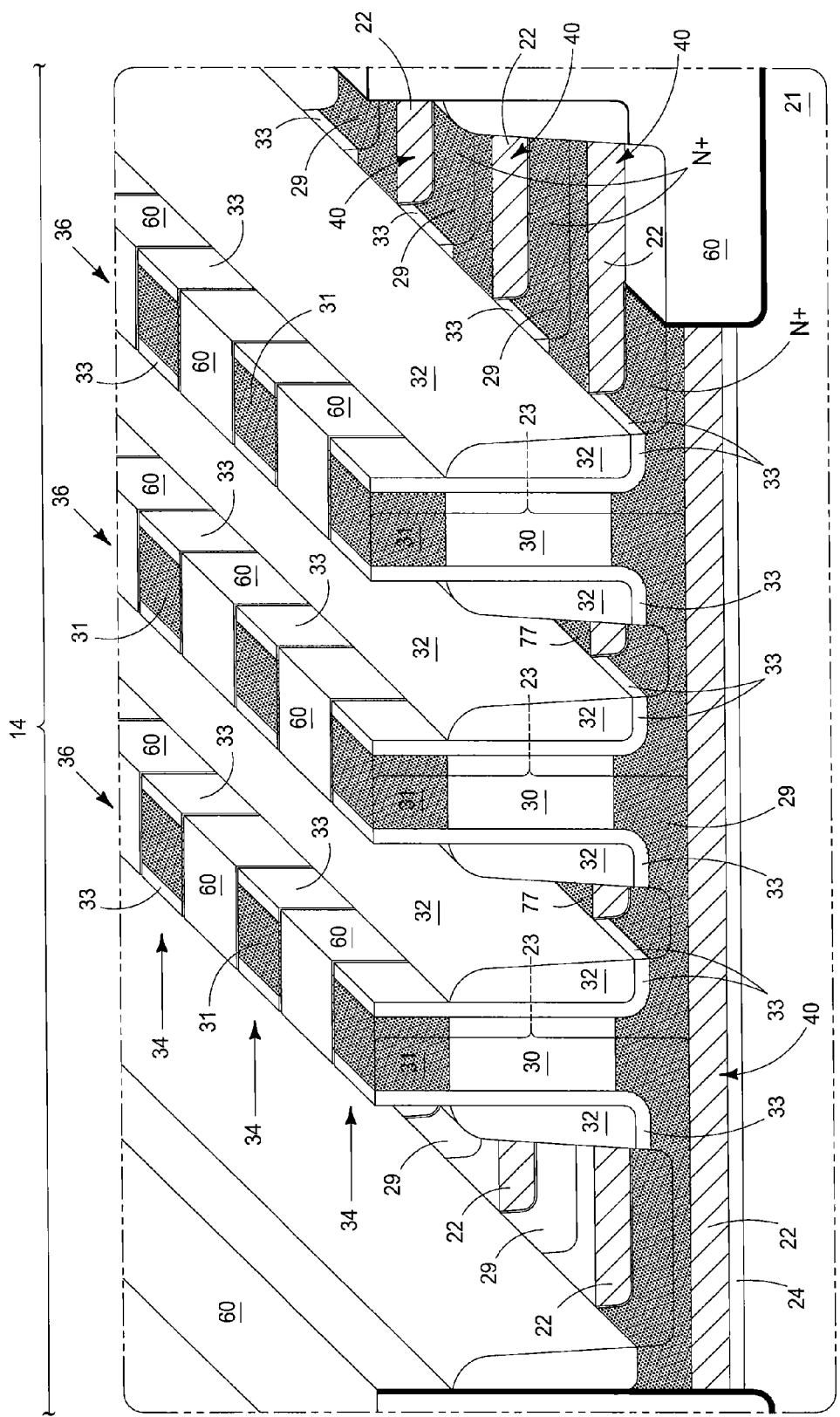
FIG. 1A is an enlargement of a portion of FIG. 1.

Some embodiments of the invention include circuit structures. In some embodiments, the circuit structure comprises memory circuitry. An example embodiment circuit structure is described initially with reference to FIGS. 1, 1A, 2 and 3. FIG. 1 is the same as FIG. 2, but wherein some operative circuit components in FIG. 2 have not been shown in FIG. 1 solely for clarity in FIG. 1. FIG. 1A is an enlargement of a portion of FIG. 1, yet also with some of the dielectric material in FIG. 1 having been removed for clarity in seeing certain operative components in FIG. 1A.

Referring to FIGS. 1 and 1A, a circuit structure 10 includes a substrate 12 comprising an array region 14 and a peripheral region 16, 18. Two peripheral regions 16 and 18 are shown on laterally opposing sides of array region 14, and may be collectively considered as a peripheral region. There may be more or fewer than two peripheral regions relative to array region 14, and the peripheral region(s) may be of any shape, position, or configuration. In one embodiment, one of two peripheral regions will be used primarily for fabrication of p-type circuitry (e.g., PMOS) and another of two peripheral regions will be used primarily for fabrication of n-type circuitry (e.g., NMOS). In one embodiment, array region 14 comprises a memory array which includes a plurality of memory cells. Logic circuitry may be fabricated outside of array region 14. Control and/or other peripheral circuitry for operating a memory array may or may not be fully or partially within array region 14, with an example memory array region 14 as a minimum encompassing all of the memory cells of a given memory array/sub-memory array. Further, multiple sub-arrays might also be fabricated and operated independently, in tandem, or otherwise relative one another. As used herein, a "sub-array" or "sub-memory array" may be considered as an array.

Substrate 12 in array region 14 and peripheral region 16, 18 comprises a semiconductor-metal-on-insulator (SMOI) structure. Such structure includes, in one embodiment, a first semiconductor material 20, an insulator material 21 (i.e., dielectric) over first semiconductor material 20, conductive material 22 over insulator material 21, and second semiconductor material 23 over conductive material 22. Each of materials 20, 21, 22 and 23 may be homogenous or non-homogenous. In one embodiment, second semiconductor material 23 comprises regions of different conductivity type (i.e., p and n) in each of array region 14 and peripheral region 16, 18. First semiconductor material 20 and second semiconductor material 23 may be of the same composition or of different compositions relative one another independent of or apart from conductivity modifying impurity that may be provided in each. Example semiconductor materials include silicon, silicon-germanium, gallium arsenide, gallium nitride, indium phosphide, etc. Example insulator materials 21 include silicon dioxide, borophosphosilicate glass (BPSG), borosilicate glass (BSG), phosphosilicate glass (PSG), and/or silicon nitride.

Conductive material 22 is current conductive, may be a phase change material, and may comprise metal whether in elemental, alloy, and/or compound forms. Examples include titanium, titanium silicide, titanium oxide, titanium nitride, tantalum, tantalum silicide, tantalum oxide, tantalum nitride, tungsten, tungsten silicide, tungsten oxide, tungsten nitride, other metal, other metal silicides, other metal oxides, or other metal nitride materials, including combinations thereof. In one embodiment, conductive material 22 may comprise titanium nitride including, for example, a titanium-rich titanium nitride such as metal mode titanium nitride (MMTiN).

In one embodiment, an amorphous material 24 is provided between insulator material 21 and conductive material 22 in array region 14 and peripheral region 16, 18. Amorphous material 24 may be semiconductive, with example materials including silicon and/or gallium. Amorphous material 24 may be provided to facilitate fabrication of substrate 12 where, for example, such is formed initially by combination of a donor wafer and an acceptor wafer, and regardless may or may not have an attribute associated with the functioning of the resultant circuitry.

An example thickness range for insulator material 21 is from about 5 to 200 nanometers, for amorphous material 24 from about 10 to 40 nanometers, for conductor material 22 from about 30 to 50 nanometers (e.g., from about 3 to 5 nanometers of titanium over about 20 to 40 nanometers of titanium nitride), and for second semiconductor material 23 from about 175 to 200 nanometers.

Array region 14 comprises vertical circuit devices 26 which comprise second semiconductor material 23. Peripheral region 16, 18 comprises horizontal (e.g., planar) circuit devices 28 which comprise second semiconductor material 23. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further, words such as "under", "outwardly", and "beneath" are relative terms corresponding to the vertical direction with respect to the structure being described. Vertical and horizontal as used herein for a device are with respect to direction of predominant current flow through such device. Not all vertical circuit devices 26 need be of the same construction, and array region 14 may additionally include non-vertical circuit devices. Likewise, not all horizontal devices 28 need be of the same construction, and peripheral region 16, 18 may additionally include non-horizontal circuit devices. Regardless, array region 14 may be characterized by a physical arrangement or ordering of a plurality of operative components, and that in one embodiment may be in rows and columns and in one embodiment may be of like-construction. By way of example, vertical circuit devices 26 are shown as being arrayed within array region 14 in rows 34 and columns 36. Only some of such rows and columns are shown for clarity in the drawings with perhaps thousands or more such rows and columns being provided within an array. Further, devices 26, 28 are shown only diagrammatically for clarity, and the devices may be positioned much closer together within the respective regions.

In one embodiment and as shown, vertical circuit devices 26 comprise transistors. Alternate or additional example vertical circuit devices will be described below. Vertical transistors 26 individually comprise a bottom source/drain region 29, a top source/drain region 31, and a channel region 30 between the top and bottom source/drain regions, with each of these regions comprising second semiconductor material 23. A gate 32 is provided operatively laterally proximate channel region 30. Gate dielectric 33 is between gate 32 and channel region 30. The example embodiment depicts dual-gated channel regions 30 having two gate portions 32 formed on opposing lateral sides of each channel region 30. Gates 32 may comprise any suitable conductive material and may longitudinally extend as lines in column direction 36. Conductive material 22 in array region 14 may be in the form of conductive straps 40 that are under and electrically coupled to a plurality of vertical circuit devices 26. In one embodiment, individual conductive straps 40 are electrically coupled to or with bottom source/drain regions 29 of vertical transistors 26 within an individual row 34.

Horizontal circuit devices 28 within peripheral region 16, 18 may comprise transistors. For example, second semiconductor material 23 of individual horizontal circuit devices 28 comprises a pair of source/drain regions 42 having a channel region 44 there-between. An example gate line construction 46 is over channel regions 44, and may comprise a conductively doped semiconductor region 48 (e.g., conductively doped polysilicon), a higher conductivity metal region 50 thereover (e.g., one or both of an elemental metal and metal silicide), and a dielectric cap 52. A gate dielectric 54 is between conductive material 48 and channel region 44. Channel region 44 comprises part of a floating body 56 within second semiconductor material 23. Conductive material 22 is under and electrically coupled to second semiconductor material 23 of floating bodies 56. In one embodiment and as shown, conductive material 22 in peripheral region 16, 18 is under all of floating bodies 56 within a blanket area of the peripheral region (e.g., either of blanket areas 16 or 18) and is continuously connected there-within. In operation, suitable potential(s) provided to conductive material 22 in peripheral region(s) 16, 18 may be used to reduce or to control floating body effect with respect to horizontal circuit devices 28.

Second semiconductor material 23 in peripheral region 16, 18 may comprise an NMOS region and a PMOS region. As an example, region 16 may be NMOS and region 18 may be PMOS. For example within NMOS region 16, source/drain regions 42 may be heavily doped n-type, semiconductor material 48 of gate line 46 may be heavily doped n-type, and floating body region 56 (and channel region 44) may be lightly doped p-type. In the figures, n-type is indicated with stippling, with the denser stippling indicating heavy doping and the less dense stippling indicating lighter doping. In one embodiment, p-type material within NMOS region 16 is directly against conductive material 22. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another. In one embodiment, second semiconductor material 23 within NMOS region 16 may additionally include highly doped p-type regions 59 directly against conductive material 22 for better electrical coupling therewith.

Within PMOS region 18, source/drain regions 42 may be heavily doped p-type (i.e., to a concentration of at least about $1 \times 10^{20}$ atoms/cm$^3$), semiconductor material 48 of gate line 46 may be heavily doped p-type, and channel region 44 may be lightly doped n-type (i.e., to a concentration no greater than about $1 \times 10^{19}$ atoms/cm$^3$). In one embodiment and as shown, PMOS region 18 comprises n-type material directly against conductive material 22. In one embodiment, second semiconductor material 23 within PMOS region 18 may include highly doped n-type regions 61 directly against conductive material 22.

Dielectric material 60 is provided as isolation between certain immediately adjacent device components within array region 14 and between certain immediately adjacent device components within peripheral region 16, 18. Dielectric material 60 may be homogenous or non-homogenous, with doped and undoped silicon dioxide and silicon nitride being examples. Dielectric material 60 may be over conductive material 22 and lateral of second semiconductor material 23 within array region 14 and peripheral region 16, 18. The same or different composition dielectric material would be received atop substrate 12, but is not shown in the figures for clarity with respect to other components.

Figure 2:
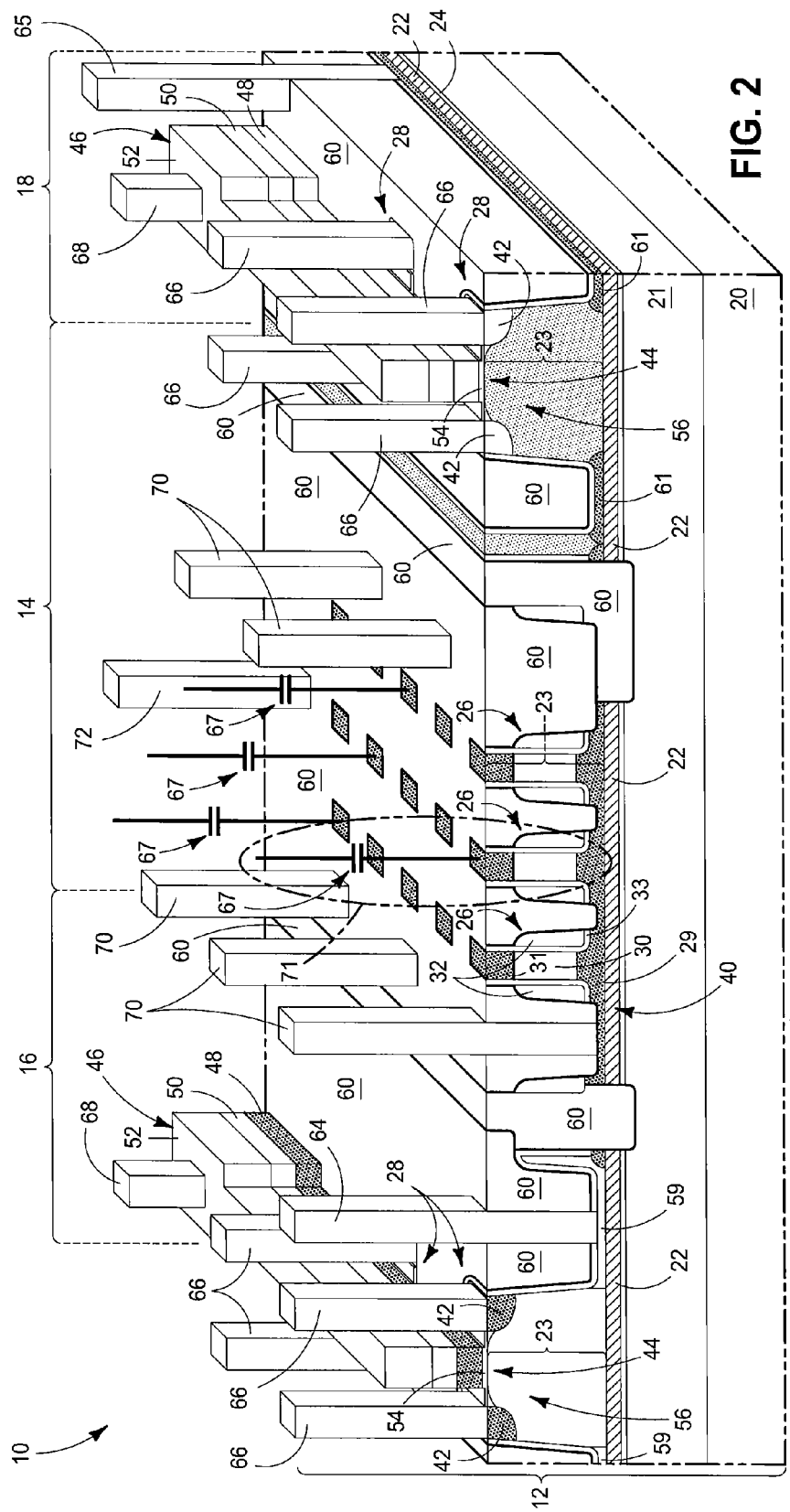
FIG. 2 is another view of the FIG. 1 circuit structure showing additional operative components

A conductive contact is provided within the peripheral region which extends to the conductive material through dielectric material that is over the conductive material and lateral of the second semiconductive material. Conductive contacts are shown in FIG. 2 but not in FIGS. 1 and 1A for better clarity in FIG. 1 with respect to circuit components other than the contacts. FIG. 2 depicts a peripheral region conductive contact 64 which extends to conductive material 22 within NMOS region 16. A peripheral region conductive contact 65 extends to conductive material 22 within PMOS region 18. Additional peripheral region conductive contacts 66 extend to source/drain regions 42 in NMOS region 16 and PMOS region 18. Further, peripheral region conductive contacts 68 extend through dielectric caps 52 to conductive material 50 of gate line constructions 46. Array region 14 includes conductive contacts 70 which extend to individual conductive straps 40. Array region 14 also includes conductive contacts 72 (only one being shown in FIG. 2) which respectively extend to an end of a pair of gate lines 32 which straddle channel regions 30 along individual columns 36 (FIGS. 1, 1A).

Figure 4:
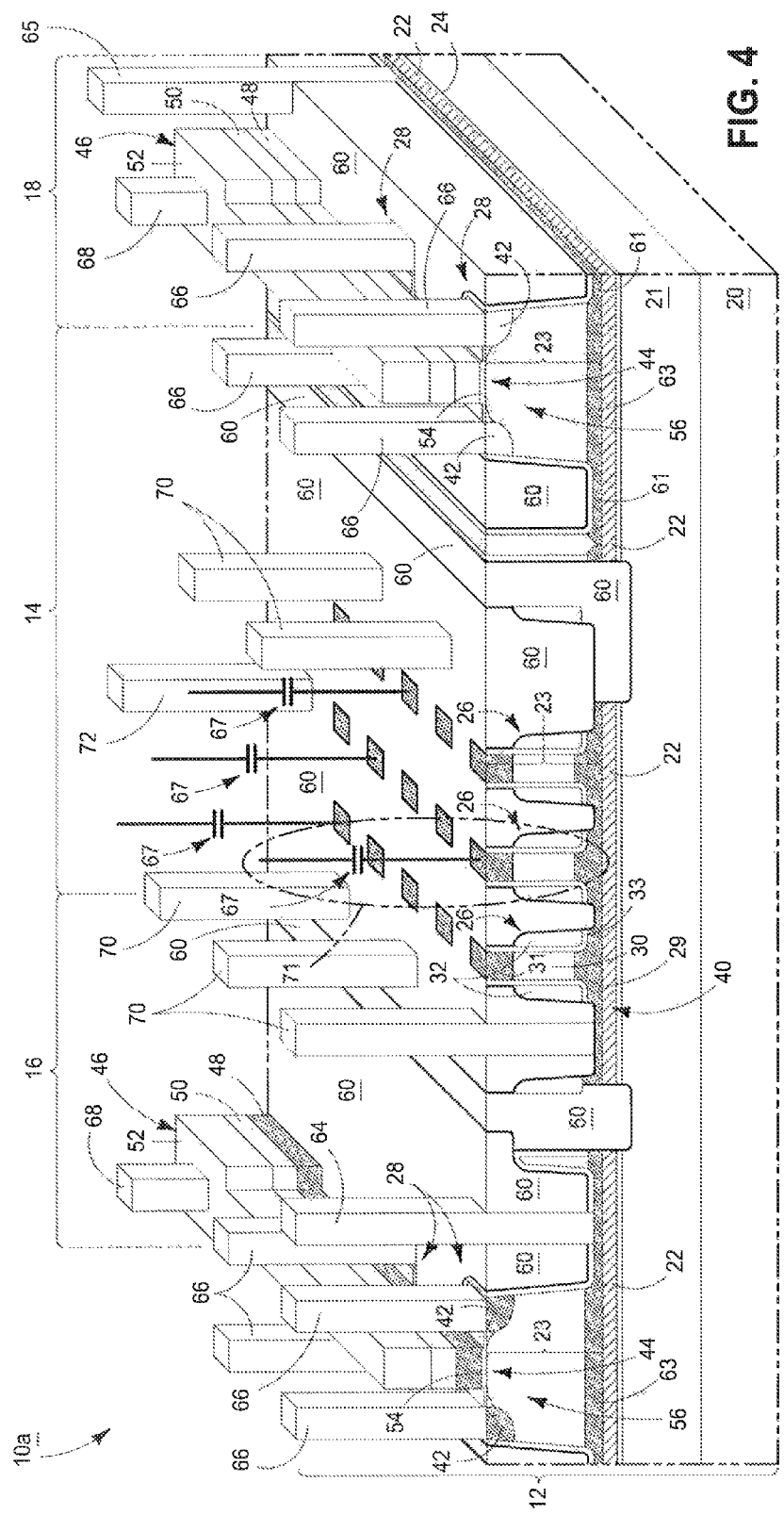
FIG. 4 is a diagrammatic oblique projection and partial schematic view of part of a circuit structure in accordance with an embodiment of the invention.

An alternate embodiment circuit structure 10a is shown in FIG. 4. Like numerals from the FIG. 2 embodiment are used where appropriate, with some construction differences being indicated with the suffix "a" or with different numerals. In one embodiment, an NMOS region has n-type material of the second semiconductor material between the conductive material and the p-type material, and in one embodiment also directly against the conductive material. In FIG. 4, second semiconductor material 23 in NMOS region 16 includes n-type material 63 directly against conductive material 22. In contrast in the example FIGS. 1 and 2 embodiment, an NMOS region 16 has p-type material of second semiconductor material 23 directly against conductive material 22.

Some embodiments of the invention comprise memory circuitry. In one example and with reference to FIGS. 1-4, a substrate has a memory array region 14 and a peripheral region (e.g., either of region 16 or 18 taken alone or in combination). The memory circuitry includes horizontal transistors 28 in peripheral region(s) 16, 18 which individually comprise a floating body 56 comprising second semiconductor material 23. Conductive material 22 in peripheral region(s) 16, 18 is under and electrically couples to second semiconductor material 23 of floating bodies 56. Conductive material 22 in memory array region 14 may comprise individual digit lines (e.g., individual lines 40) under and electrically coupled to bottom source/drain regions 29 of rows 34 of vertical transistors 26 in memory array region 14.

Word lines, for example conductive lines 32, are operatively received laterally adjacent channel regions 30 along columns 36 of vertical transistors 26 in memory array region 14. Charge storage devices are provided which individually electrically couple to respective of the top source/drain regions 31. Any suitable charge storage device may be used, with some capacitors 67 being shown schematically as an example in FIG. 1. Array region 14 includes a plurality of memory cells, with one such memory cell being designated in FIGS. 1, 2, and 4 with a circle 71.

Figure 3:
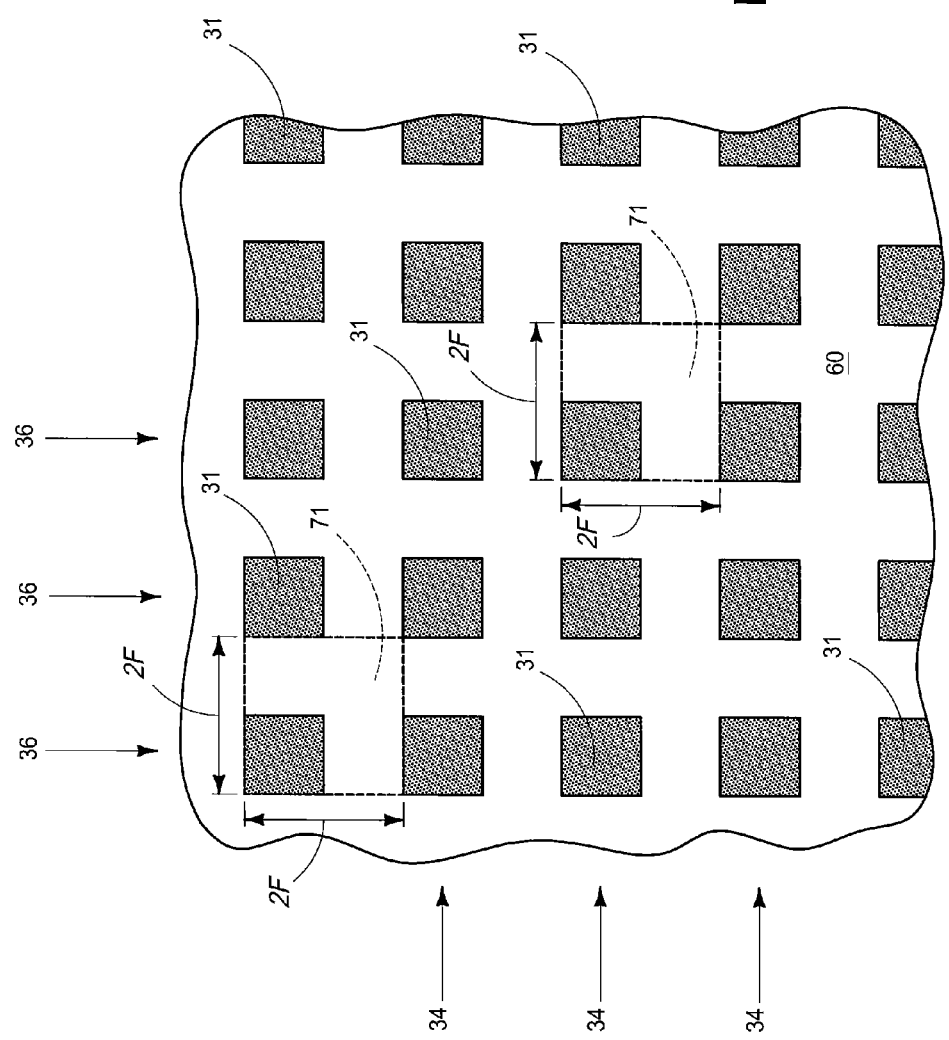
FIG. 3 is a diagrammatic partial top plan view of a portion of a FIG. 1-*like* circuit structure.

In one embodiment, individual memory cells of an array occupy about $4F^2$ of horizontal area, where "F" is the minimum lateral feature dimension of the smallest feature that is formed using feature edges of a mask pattern that is received outwardly of material from which such smallest features are formed. For example, FIG. 3 is a diagrammatic top plan view showing individual memory cells 71 received within 2F by 2F squares.

In one embodiment, memory circuitry comprises a substrate having a memory array region and a peripheral region. The substrate in the peripheral and memory array regions comprises insulator material over first semiconductor material, conductive material over the insulator material, and second semiconductor material over the conductive material. The memory array region comprises a plurality of memory cells individually comprising a vertically oriented circuit device which comprises the second semiconductor material. Memory cells 71 in FIG. 1 are but one example such memory cell. However, any memory cell construction may be employed which has at least two electrodes encompassed by or constituting at least a portion of a vertically oriented circuit device (not necessarily a transistor). Such memory cells may be volatile or nonvolatile, and regardless may be capable of random access. By ways of example only, examples include resistive, conductive bridging, phase change, floating body, and/or thyristor based random access memories which may be vertically oriented and thereby constitute a vertical circuit device. Regardless, in such memory circuitry, horizontal circuit devices are included in the peripheral region, and which individually comprise a floating body comprising the second semiconductor material. The conductive material in the peripheral region is under and electrically coupled to the second semiconductor material of the floating bodies. The conductive material in the memory array region includes individual access lines under and electrically coupled to rows of the vertically oriented circuit devices of the memory cells in the memory array region.

Any of the above constructions may be fabricated in accordance with any existing or yet-to-be-developed technique(s). An example manner of fabricating the circuit structure of FIGS. 1, 1A, and 2 is next described with reference to FIGS. 5-11 and FIG. 2. Nevertheless, structural aspects of the invention are not limited by the method of manufacture, nor are the claimed methods limited by structure unless language literally appears in the claim under analysis. Like numerals from the above-described embodiments have been used where appropriate. Further, many of the numerals are used to designate the materials from which the components of FIGS. 1, 1A, and 2 are fabricated prior to them necessarily being of the final example shapes for clarity in the drawings and ease of understanding in the description.

Figure 5:
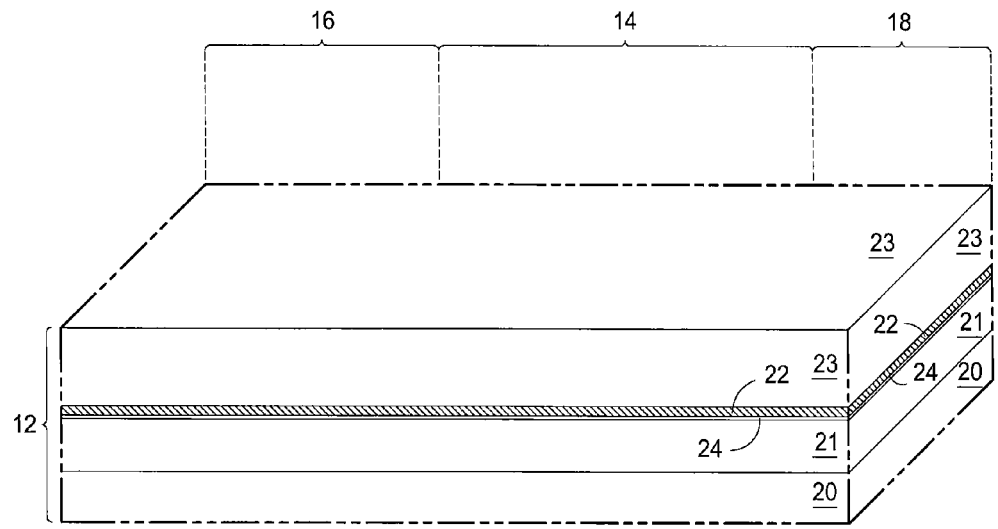
FIG. 5 is a diagrammatic oblique projection view of part of a substrate in process in accordance with an embodiment of the invention.

Referring to FIG. 5, a substrate 12 in process has been formed to constitute a semiconductor-metal-on-insulator substrate having semiconductor material 20, insulator material 21, conductive material 22, and second semiconductor material 23 extending from an array region 14 to a peripheral region (i.e., into either of peripheral regions 16 and 18 considered separately or in combination). In one embodiment, semiconductor materials 20, 23 and conductive material 22 of a semiconductor-metal-on-insulator substrate are formed at the same levels and at the same time within a peripheral region 16 and/or 18 and within an array region 14. In one embodiment, amorphous material 24 is between conductive material 22 and insulator 21. Substrate 12 may be formed by any suitable methods which are not particular material to this disclosure. Yet as an example, an acceptor wafer comprising materials 20 and 21 may be bonded with a donor wafer comprising materials 22, 23, and 24. Amorphous material 24 may function as an adhesion material during bonding of the donor and acceptor wafers, and the donor wafer may include an outer cleave portion formed by implanting an atomic species (e.g., hydrogen) into the substrate. Bonding may occur by application of heat, for example heating one or both wafers to a temperature of from about 300° C. to about 400° C. Smart-Cut® or other technology may be used. Example techniques are as described in our U.S. patent application Ser. No. 12/715,704, filed Mar. 2, 2010, entitled "Semiconductor- Metal-On-Insulator Structures, Methods of Forming Such Structures, and Semiconductor Devices Including Such Structures".

Figure 6:
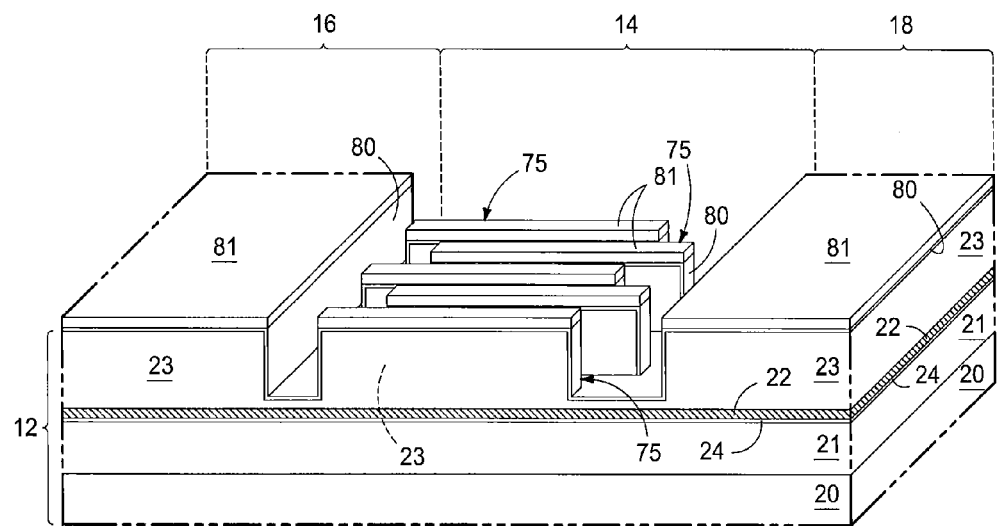
FIG. 6 is a view of the FIG. 5 substrate at a processing step subsequent to that shown by FIG. 5.

Referring to FIG. 6, substrate 12 has been processed whereby array region 14 includes outlines 75 for the conductive straps/lines 40 (not shown) that are to be formed which will comprise conductive material 22. Outlines 75 may be formed using pitch multiplication techniques. Regardless, second semiconductor material 23 has been etched through within array region 14 to leave some of second semiconductor material 23 (e.g., from about 40 to 50 nanometers) over conductive material 22. In one embodiment, a silicon dioxide material 80 (e.g., about 6 nanometers) has been formed over second semiconductor material 23, and hard masking material 81 (e.g., silicon nitride) has been formed thereover. Patterning may occur with formation of desired conductivity type and concentration within all or some of the array and/or peripheral regions before and/or after forming materials 80, 81.

Figure 7:
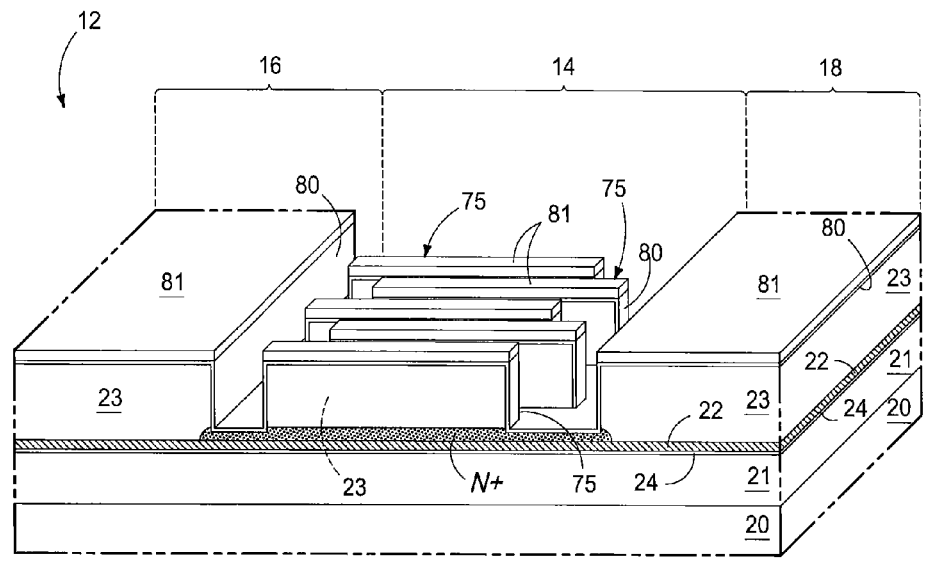
FIG. 7 is a view of the FIG. 6 substrate at a processing step subsequent to that shown by FIG. 6.

Referring to FIG. 7, ion implanting has been conducted to form a highly doped n-type region (shown as N+) from which source/drain regions 29 may be ultimately formed. An example implant species is arsenic implanted at an example energy of 7 KeV and dose of $1 \times 10^{15}$ atoms/cm$^2$. Where outlines 75 are sufficiently laterally thin, the n-type implanted material will sufficiently diffuse laterally to join beneath such outlines. Such diffusion may thereby form a blanketing N+ implanted region under and between outlines 75 within all of array region 14. Such diffusion may, for example, occur in conjunction with activating such implanted dopants, for example at a temperature of 955° C. for 20 seconds in an $N_2$ ambient.

Figure 8:
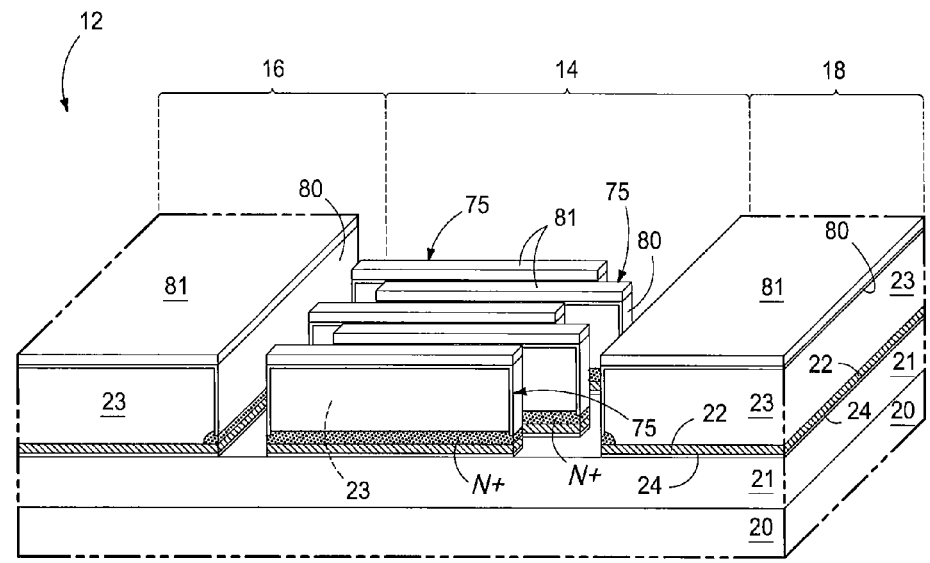
FIG. 8 is a view of the FIG. 7 substrate at a processing step subsequent to that shown by FIG. 7.

Referring to FIG. 8, masking material 81 has been used as a mask while etching remaining second semiconductor material 23 received between outlines 75 in array region 14, and to etch through conductive material 22 and amorphous material 24 to insulator material 21. The mask may also be used to separate conductive material 22 from being connected between peripheral region(s) 16, 18 and array region 14. Such provides but one example embodiment of subtractively patterning conductive material 22 within array region 14 and to separate such conductive material from being connected between peripheral region(s) 16, 18 and array region 14 at the same time. In one embodiment, such also comprises an example of subtractively patterning conductive material 22 within array region 14 and separating conductive material 22 from being connected between peripheral region(s) 16, 18 and array region 14 using a common masking step (e.g., that mask depicted as being formed in FIG. 7). One embodiment of the invention includes removing some of conductive material 22 within array region 14 while leaving at least some of conductive material 22 in peripheral region(s) 16, 18. FIG. 8 shows an act of removing some conductive material 22 that leaves at least a majority of conductive material 22 remaining in peripheral region(s) 16, 18.

Figure 9:
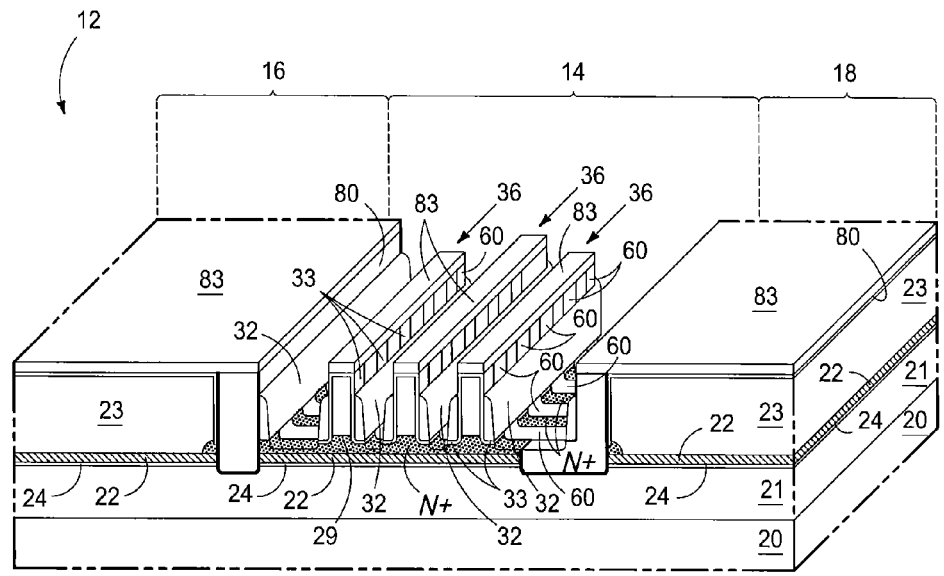
FIG. 9 is a view of the FIG. 8 substrate at a processing step subsequent to that shown by FIG. 8.

Processing may continue in fabrication of the example structure of FIG. 2. For example, the substrate of FIG. 8 may be covered with a thin blanketing nitride layer, followed by filling of the remaining void space with a spin-on dielectric. The resultant dielectric may be of the same composition as dielectric 60. Thereafter, such dielectric may be planarized back to stop on mask material 81. More nitride 83 may be deposited and the substrate patterned, for example as shown in FIG. 9 to form column lines 36. Pitch multiplication may be used. Exposed dielectric and exposed second semiconductor material 23 may be etched inwardly to the N+ regions. Gate dielectric 33 may then be formed, for example by selective oxidation. A suitable gate material 32 may be deposited over gate dielectric 33, and then spacer-etched. The spacer etching may over-etch into the N+ regions as shown. Regardless, N+ source/drain regions 29 may result.

Figure 10:
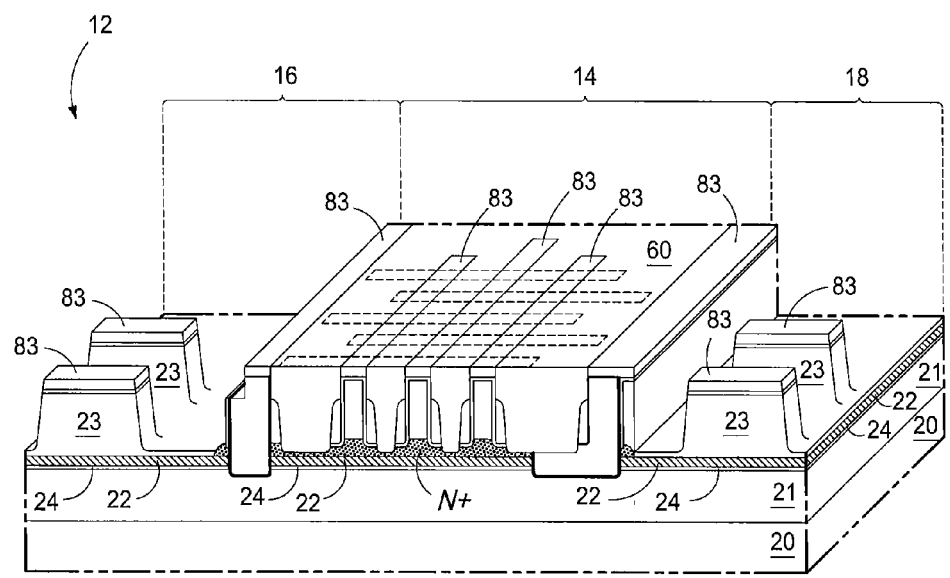
FIG. 10 is a view of the FIG. 9 substrate at a processing step subsequent to that shown by FIG. 9.

Referring to FIG. 10, the void space of FIG. 9 that was within array area 14 has been filled with dielectric 60. Further, second semiconductor material 23 within peripheral region(s) 16, 18 has been patterned for ultimate formation of spaced horizontal devices comprising floating bodies which include second semiconductor material 23.

Figure 11:
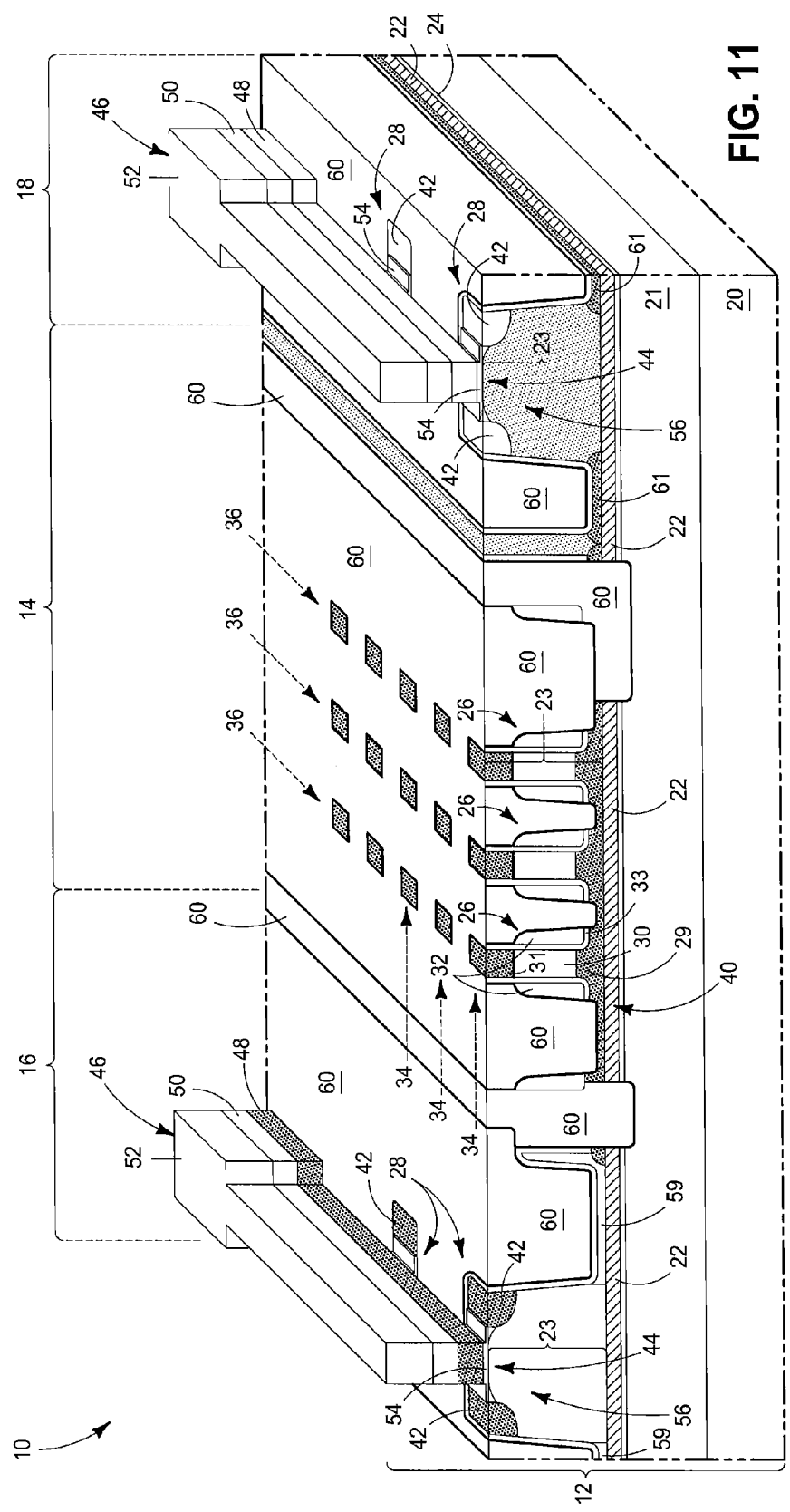
FIG. 11 is a view of the FIG. 10 substrate at a processing step subsequent to that shown by FIG. 10.

Referring to FIG. 11, suitable subsequent processing has occurred for formation of NMOS region 16 and PMOS region 18, including formation of gate constructions 46. If material 48 comprises conductively doped semiconductive material, such may be heavily doped n-type in NMOS peripheral region 16 and p-type in peripheral region 18. Dielectric material may be subsequently formed over dielectric material 60, with the example conductive contacts 65, 66, 68, 70 and 72 (FIG. 2) ultimately being formed. Some or all of the openings for the conductive contacts 65, 66, 68, 70 and 72 may be formed using a single masking step.

A method embodiment of the invention includes forming conductive contacts through dielectric material to the conductive material in the peripheral region and to the conductive material in the array region using only a single mask. For example referring to FIG. 2, a single mask may be used for forming one or both of conductive peripheral contacts 64, 65 and those of conductive contacts 70 using only a single mask. In one embodiment, such single masking step may also be used to form conductive contacts 66 in peripheral region(s) 16, 18 to source/drain regions 42 and conductive contact 68 to conductive material of gate constructions 46 using such single masking step. In one embodiment, lines 40 of conductive material 22 within array region 14 may be considered as horizontally elongated first conductive lines to which conductive contacts 70 are formed. Material 32 comprises horizontally elongated second conductive lines in array region 14 that are over first conductive lines 40. Conductive contacts 72 may be formed to second conductive lines 32 within array region 14 using such single masking step.

CONCLUSION

In some embodiments, a circuit structure comprises a substrate comprising an array region and a peripheral region. The substrate in the array and peripheral regions comprises insulator material over first semiconductor material, conductive material over the insulator material, and second semiconductor material over the conductive material. The array region comprises vertical circuit devices comprising the second semiconductor material. The peripheral region comprises horizontal circuit devices comprising the second semiconductor material. The horizontal circuit devices in the peripheral region individually comprise a floating body comprising the second semiconductor material. The conductive material in the peripheral region is under and electrically coupled to the second semiconductor material of the floating bodies. Conductive straps in the array region are under the vertical circuit devices. The conductive straps comprise the conductive material and individually are electrically coupled to a plurality of the vertical circuit devices in the array region.

In some embodiments, memory circuitry comprises a substrate comprising a memory array region and a peripheral region. The substrate in the peripheral and memory array regions comprises insulator material over first semiconductor material, conductive material over the insulator material, and second semiconductor material over the conductive material.

The memory array region comprises a plurality of memory cells individually comprising a vertically oriented circuit device comprising the second semiconductor material. Horizontal circuit devices are included in the peripheral region which individually comprise a floating body comprising the second semiconductor material. The conductive material in the peripheral region is under and electrically coupled to the second semiconductor material of the floating bodies. The conductive material in the memory array region comprises individual access lines under and electrically coupled to rows of the vertically oriented circuit devices of the memory cells in the memory array region.

In some embodiments, memory circuitry comprises a substrate comprising a memory array region and a peripheral region. The substrate in the peripheral and memory array regions comprises insulator material over first semiconductor material, conductive material over the insulator material, and second semiconductor material over the conductive material. The memory array region comprises vertical transistors individually having a bottom source/drain region comprising the second semiconductor material, a top source/drain region comprising the second semiconductor material, and a channel region comprising the second semiconductor material between the top and bottom source/drain regions. Horizontal transistors are in the peripheral region and which individually comprise a floating body comprising the second semiconductor material. The conductive material in the peripheral region is under and electrically coupled to the second semiconductor material of the floating bodies. The conductive material in the memory array region comprises individual digit lines under and electrically coupled to the bottom source/drain regions of rows of the vertical transistors in the memory array region. Word lines are operatively laterally adjacent the channel regions of columns of the vertical transistors in the memory array region. Charge storage devices are individually electrically coupled to respective of the top source/drain regions.

In some embodiments, a method comprises forming a semiconductor-metal-on-insulator substrate having the semiconductor, conductive, and insulator materials extending from an array region to a peripheral region. At the same time, the conductive material is subtractively patterned within the array region and to separate the conductive material from being connected between the peripheral region and the array region.

In some embodiments, a method comprises forming a semiconductor-metal-on-insulator substrate having the semiconductor, conductive, and insulator materials extending from an array region to a peripheral region. The conductive material is subtractively patterned within the array region and to separate the conductive material from being connected between the peripheral region and the array region using a common masking step.

In some embodiments, a method comprises forming semiconductor material and conductive material of a semiconductor-metal-on-insulator substrate at the same levels and at the same time within a peripheral region and an array region of the substrate. Some of the conductive material within the array region is removed while leaving at least some of the conductive material in the peripheral region.

In some embodiments, a method comprises forming a semiconductor-metal-on-insulator substrate having the semiconductor, conductive, and insulator materials within an array region and a peripheral region. Conductive contacts are formed through dielectric material to the conductive material in the peripheral region and to the conductive material in the array region using only a single mask.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A circuit structure, comprising:
a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material, amorphous material in the array and peripheral regions between the insulator material and the conductive material, the amorphous material in the array and peripheral regions being directly against the conductive material;
the horizontal circuit devices in the peripheral region individually comprising a floating body comprising the second semiconductor material, the conductive material in the peripheral region being under and electrically coupled to the second semiconductor material of the floating bodies;
conductive straps in the array region under the vertical circuit devices, the conductive straps comprising the conductive material and individually being electrically coupled to a plurality of the vertical circuit devices in the array region; and
the second semiconductor material in the peripheral region comprising a PMOS region, the PMOS region comprising first dopant concentration n-type material and second dopant concentration n-type material that are directly against one another, the second dopant concentration being higher than the first dopant concentration, the second dopant concentration n-type material being directly against the conductive material in the PMOS region and being laterally discontinuous across the floating body of the horizontal circuit devices in the PMOS region.

2. A circuit structure, comprising:
a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material;
the horizontal circuit devices in the peripheral region individually comprising a floating body comprising the second semiconductor material, the conductive material in the peripheral region being under and electrically coupled to the second semiconductor material of the floating bodies;
conductive straps in the array region under the vertical circuit devices, the conductive straps comprising the conductive material and individually being electrically coupled to a plurality of the vertical circuit devices in the array region;

the second semiconductor material in the peripheral region comprising a PMOS region, the PMOS region comprising first dopant concentration n-type material and second dopant concentration n-type material that are directly against one another, the second dopant concentration being higher than the first dopant concentration, the second dopant concentration n-type material being directly against the conductive material in the PMOS region and being laterally discontinuous across the floating body of the horizontal circuit devices in the PMOS region; and dielectric material over the conductive material in the PMOS region, the second dopant concentration n-type material being elevationally below and directly against the dielectric material elevationally between the dielectric material and the conductive material in the PMOS region.

3. A circuit structure, comprising:

a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material, amorphous material in the array and peripheral regions between the insulator material and the conductive material, the amorphous material in the array and peripheral regions being directly against the conductive material; the horizontal circuit devices in the peripheral region individually comprising a floating body comprising the second semiconductor material, the conductive material in the peripheral region being under and electrically coupled to the second semiconductor material of the floating bodies;

conductive straps in the array region under the vertical circuit devices, the conductive straps comprising the conductive material and individually being electrically coupled to a plurality of the vertical circuit devices in the array region; and the second semiconductor material in the peripheral region comprising an NMOS region, the NMOS region comprising first dopant concentration p-type material and second dopant concentration p-type material that are directly against one another, the second dopant concentration being higher than the first dopant concentration, the second dopant concentration p-type material being directly against the conductive material in the NMOS region and being laterally discontinuous across the floating body of the horizontal circuit devices in the NMOS region.

4. A circuit structure, comprising:

a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material;

the horizontal circuit devices in the peripheral region individually comprising a floating body comprising the second semiconductor material, the conductive material in the peripheral region being under and electrically coupled to the second semiconductor material of the floating bodies;

conductive straps in the array region under the vertical circuit devices, the conductive straps comprising the conductive material and individually being electrically coupled to a plurality of the vertical circuit devices in the array region; and the second semiconductor material in the peripheral region comprising an NMOS region, the NMOS region comprising first dopant concentration p-type material and second dopant concentration p-type material that are directly against one another, the second dopant concentration being higher than the first dopant concentration, the second dopant concentration p-type material being directly against the conductive material in the NMOS region and being laterally discontinuous across the floating body of the horizontal circuit devices in the NMOS region; and dielectric material over the conductive material in the NMOS region, the second dopant concentration p-type material being elevationally below and directly against the dielectric material elevationally between the dielectric material and the conductive material in the NMOS region.

5. A circuit structure, comprising:

a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material, amorphous material in the array and peripheral regions between the insulator material and the conductive material, the amorphous material in the array and peripheral regions being directly against the conductive material;

the horizontal circuit devices in the peripheral region individually comprising a floating body comprising the second semiconductor material, the conductive material in the peripheral region being under and electrically coupled to the second semiconductor material of the floating bodies;

conductive straps in the array region under the vertical circuit devices, the conductive straps comprising the conductive material and individually being electrically coupled to a plurality of the vertical circuit devices in the array region; and the second semiconductor material in the peripheral region comprising an NMOS region having the horizontal circuit devices therein which comprise NMOS field effect transistors having source/drain regions, the NMOS region comprising p-type material and n-type material that are directly against one another and both of which are elevationally inward of the source/drain regions, the n-type material being directly against the conductive material in the NMOS region and being laterally discontinuous across the floating body of the NMOS field effect transistors.

6. A circuit structure, comprising:
a substrate comprising an array region and a peripheral region; the substrate in the array and peripheral regions comprising insulator material over first semiconductor material, conductive material over the insulator material, and second semiconductor material over the conductive material; the array region comprising vertical circuit devices comprising the second semiconductor material, the peripheral region comprising horizontal circuit devices comprising the second semiconductor material;
the horizontal circuit devices in the peripheral region individually comprising a floating body comprising the second semiconductor material, the conductive material in the peripheral region being under and electrically coupled to the second semiconductor material of the floating bodies;
conductive straps in the array region under the vertical circuit devices, the conductive straps comprising the conductive material and individually being electrically coupled to a plurality of the vertical circuit devices in the array region; and
the second semiconductor material in the peripheral region comprising an NMOS region having the horizontal circuit devices therein which comprise NMOS field effect transistors having source/drain regions, the NMOS region comprising p-type material and n-type material that are directly against one another and both of which are elevationally inward of the source/drain regions, the n-type material being directly against the conductive material in the NMOS region and being laterally discontinuous across the floating body of the NMOS field effect transistors; and
dielectric material over the conductive material in the NMOS region, the p-type material being elevationally below and directly against the dielectric material elevationally between the dielectric material and the conductive material in the NMOS region.

7. The circuit structure of claim 1 wherein the second dopant concentration n-type material is longitudinally continuous between immediately longitudinally adjacent of the horizontal circuit devices in the PMOS region.

8. The circuit structure of claim 2 wherein the second dopant concentration n-type material is longitudinally continuous between immediately longitudinally adjacent of the horizontal circuit devices in the PMOS region.

9. The circuit structure of claim 1 comprising a conductive contact directly against the second dopant concentration n-type material in the PMOS region.

10. The circuit structure of claim 2 comprising a conductive contact directly against the second dopant concentration n-type material in the PMOS region.

11. The circuit structure of claim 3 comprising a conductive contact directly against the second dopant concentration p-type material in the NMOS region.

12. The circuit structure of claim 4 comprising a conductive contact directly against the second dopant concentration p-type material in the NMOS region.

13. The circuit structure of claim 5 comprising a conductive contact directly against the second dopant concentration p-type material in the NMOS region.

14. The circuit structure of claim 6 comprising a conductive contact directly against the second dopant concentration p-type material in the NMOS region.

* * * * *